(12) United States Patent
Yamauchi

(10) Patent No.: US 10,984,699 B2
(45) Date of Patent: Apr. 20, 2021

(54) LIQUID CRYSTAL PANEL DRIVE CIRCUIT AND LIQUID CRYSTAL DISPLAY APPARATUS

(71) Applicant: DENSO CORPORATION, Kariya (JP)

(72) Inventor: Shunji Yamauchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/792,366

(22) Filed: Feb. 17, 2020

(65) Prior Publication Data

US 2020/0184876 A1    Jun. 11, 2020

Related U.S. Application Data

(63) Continuation of application No. PCT/JP2018/031060, filed on Aug. 23, 2018.

(30) Foreign Application Priority Data

Sep. 5, 2017 (JP) .............................. JP2017-170584

(51) Int. Cl.
  *G09G 3/20* (2006.01)
  *G02F 1/133* (2006.01)
  *G02F 1/1345* (2006.01)
  *H03H 7/06* (2006.01)

(52) U.S. Cl.
  CPC ....... *G09G 3/2018* (2013.01); *G02F 1/13306* (2013.01); *G02F 1/13452* (2013.01); *H03H 7/06* (2013.01)

(58) Field of Classification Search
  None
  See application file for complete search history.

(56) References Cited

U.S. PATENT DOCUMENTS

| | | | | |
|---|---|---|---|---|
| 7,417,616 | B2* | 8/2008 | Min ..................... | G09G 3/3696 315/291 |
| 7,499,014 | B2 | 3/2009 | Park | |
| 8,054,263 | B2* | 11/2011 | Qi ........................ | G09G 3/3648 345/87 |
| 8,384,643 | B2* | 2/2013 | Hasegawa ............ | G09G 3/3688 345/98 |
| 8,570,350 | B2* | 10/2013 | Ikeda ................... | G09G 3/3685 345/690 |
| 8,952,923 | B2* | 2/2015 | Mizuhashi ........... | G09G 3/3655 345/174 |
| 8,994,756 | B2* | 3/2015 | Kimura ................ | G09G 3/3291 345/690 |

(Continued)

*Primary Examiner* — Vinh T Lam
(74) *Attorney, Agent, or Firm* — Posz Law Group, PLC

(57) ABSTRACT

A drive circuit for a liquid crystal panel includes a voltage output device, a resistive voltage dividing circuit, and a low-pass filter. The voltage output device has a pulse-signal output port, a first port and a second port. The pulse-signal output port outputs a pulse signal, which is modulated by pulse width modulation. The first port and the second port switch an output between a DC power supply voltage and a ground voltage. The resistive voltage dividing circuit is connected to the first port and the second port. The low-pass filter has an input and an output. The input of the low-pass filter connected to a voltage output node of the resistive voltage dividing circuit and the pulse-signal output port. The output of the low-pass filter connected to a terminal, which outputs a voltage to the liquid crystal panel.

4 Claims, 7 Drawing Sheets

(56) References Cited

U.S. PATENT DOCUMENTS

| | | | | |
|---|---|---|---|---|
| 9,135,876 B2* | 9/2015 | Xiao | | G09G 3/3655 |
| 9,298,294 B2* | 3/2016 | Takeuchi | | G09G 3/3655 |
| 9,378,707 B2* | 6/2016 | Lee | | G09G 3/3208 |
| 9,603,219 B2* | 3/2017 | Dai | | H02M 7/04 |
| 9,778,713 B2* | 10/2017 | Reynolds | | G06F 3/0443 |
| 10,067,595 B2* | 9/2018 | Jeong | | G06F 1/3265 |
| 10,206,252 B2* | 2/2019 | Galvano | | H05B 45/10 |
| 10,345,971 B2* | 7/2019 | Yoshii | | G06F 3/0446 |
| 2006/0001640 A1* | 1/2006 | Lee | | G09G 3/3696 |
| | | | | 345/100 |
| 2007/0046619 A1* | 3/2007 | Sano | | G09G 3/3406 |
| | | | | 345/102 |
| 2007/0109253 A1* | 5/2007 | Zhou | | H05B 45/37 |
| | | | | 345/102 |
| 2007/0171181 A1* | 7/2007 | Hsu | | H05B 41/2822 |
| | | | | 345/102 |
| 2008/0174541 A1* | 7/2008 | Chen | | H05B 41/282 |
| | | | | 345/102 |
| 2008/0273026 A1* | 11/2008 | Nishinosono | | H05B 41/3927 |
| | | | | 345/212 |
| 2008/0309608 A1* | 12/2008 | Shen | | G09G 3/3696 |
| | | | | 345/101 |
| 2008/0316154 A1* | 12/2008 | Kim | | G09G 3/3655 |
| | | | | 345/87 |
| 2009/0009459 A1* | 1/2009 | Miyashita | | G09G 3/3648 |
| | | | | 345/93 |
| 2013/0241976 A1* | 9/2013 | Kang | | G09G 3/3611 |
| | | | | 345/691 |
| 2014/0375706 A1* | 12/2014 | Lee | | G09G 3/003 |
| | | | | 345/697 |
| 2015/0188431 A1* | 7/2015 | Cho | | G09G 3/2003 |
| | | | | 345/212 |
| 2016/0104406 A1* | 4/2016 | Hwang | | G09G 3/20 |
| | | | | 345/55 |
| 2016/0125791 A1* | 5/2016 | Park | | G09G 3/3208 |
| | | | | 345/211 |
| 2016/0247471 A1* | 8/2016 | Zhang | | H05B 45/44 |
| 2016/0260374 A1* | 9/2016 | Inoue | | G09G 3/3696 |
| 2016/0285369 A1* | 9/2016 | Koyama | | H01L 29/7869 |
| 2017/0084243 A1* | 3/2017 | Ohmid Zohoor | | G09G 3/3659 |
| 2017/0168624 A1* | 6/2017 | Lee | | G06F 3/0412 |
| 2017/0185196 A1* | 6/2017 | Kim | | G06F 3/0418 |
| 2017/0193887 A1* | 7/2017 | Wang | | G11C 19/184 |
| 2017/0243530 A1* | 8/2017 | Kwon | | H02M 1/15 |
| 2018/0047535 A1* | 2/2018 | Sugisawa | | H01H 47/02 |
| 2018/0107309 A1* | 4/2018 | Endo | | G09G 3/3655 |
| 2018/0226133 A1* | 8/2018 | Feng | | G09G 3/20 |
| 2018/0336957 A1* | 11/2018 | Mi | | G11C 19/287 |
| 2018/0365468 A1* | 12/2018 | Wang | | G06F 3/04182 |

* cited by examiner

CORRECTION VALUE MAPPING

|      | COM0 | COM1 | COM2 | COM3 |
|------|------|------|------|------|
| SEG0 | 0    | 0    | 0    | 0    |
| SEG1 | 5    | 0    | 0    | 0    |
| SEG2 | 8    | 2    | 2    | 2    |
| SEG3 | 3    | 3    | 3    | 3    |
| SEG4 | 9    | 5    | 5    | 5    |
| SEG5 | 12   | 9    | 11   | 11   |
| SEG6 | 15   | 11   | 15   | 15   |
| SEG7 | 8    | 10   | 12   | 12   |

LIQUID CRYSTAL PANEL DRIVE CIRCUIT AND LIQUID CRYSTAL DISPLAY APPARATUS

CROSS REFERENCE TO RELATED APPLICATIONS

The present application is a continuation application of International Patent Application No. PCT/JP2018/031060 filed on Aug. 23, 2018, which designated the U.S. and claims the benefit of priority from Japanese Patent Application No. 2017-170584 filed on Sep. 5, 2017. The entire disclosures of all of the above applications are incorporated herein by reference.

TECHNICAL FIELD

The present disclosure relates to a liquid crystal panel drive circuit and a liquid crystal display apparatus.

BACKGROUND

A liquid crystal panel drive circuit may generate multiple gradation voltages, which are obtained by dividing a power supply voltage through multiple resistive elements. It may be possible to display multiple intermediate gradation levels on a liquid crystal panel when the gradation voltage is output to the liquid crystal panel. A segment-type liquid crystal panel may be an example of the liquid crystal panel. In the segment-type liquid crystal panel, a shape to be displayed is divided into several segments. A voltage is applied to each segment. The segment-type liquid crystal panel may be, for example, a seven-segment display for displaying a number. The segment-type liquid crystal panel may also be used for displaying an air-conditioning state inside a vehicle cabin. The cost of the segment-type liquid crystal panel is less than the cost of the dot-matrix liquid crystal panel.

SUMMARY

The present disclosure describes a liquid crystal panel drive circuit and a liquid crystal display apparatus. In particular, the present disclosure describes display of intermediate gradation on the liquid crystal panel.

BRIEF DESCRIPTION OF DRAWINGS

The above and other objects, features and advantages of the present disclosure will become more apparent from the following detailed description made with reference to the accompanying drawings.

DETAILED DESCRIPTION OF EMBODIMENTS

Figure 1:
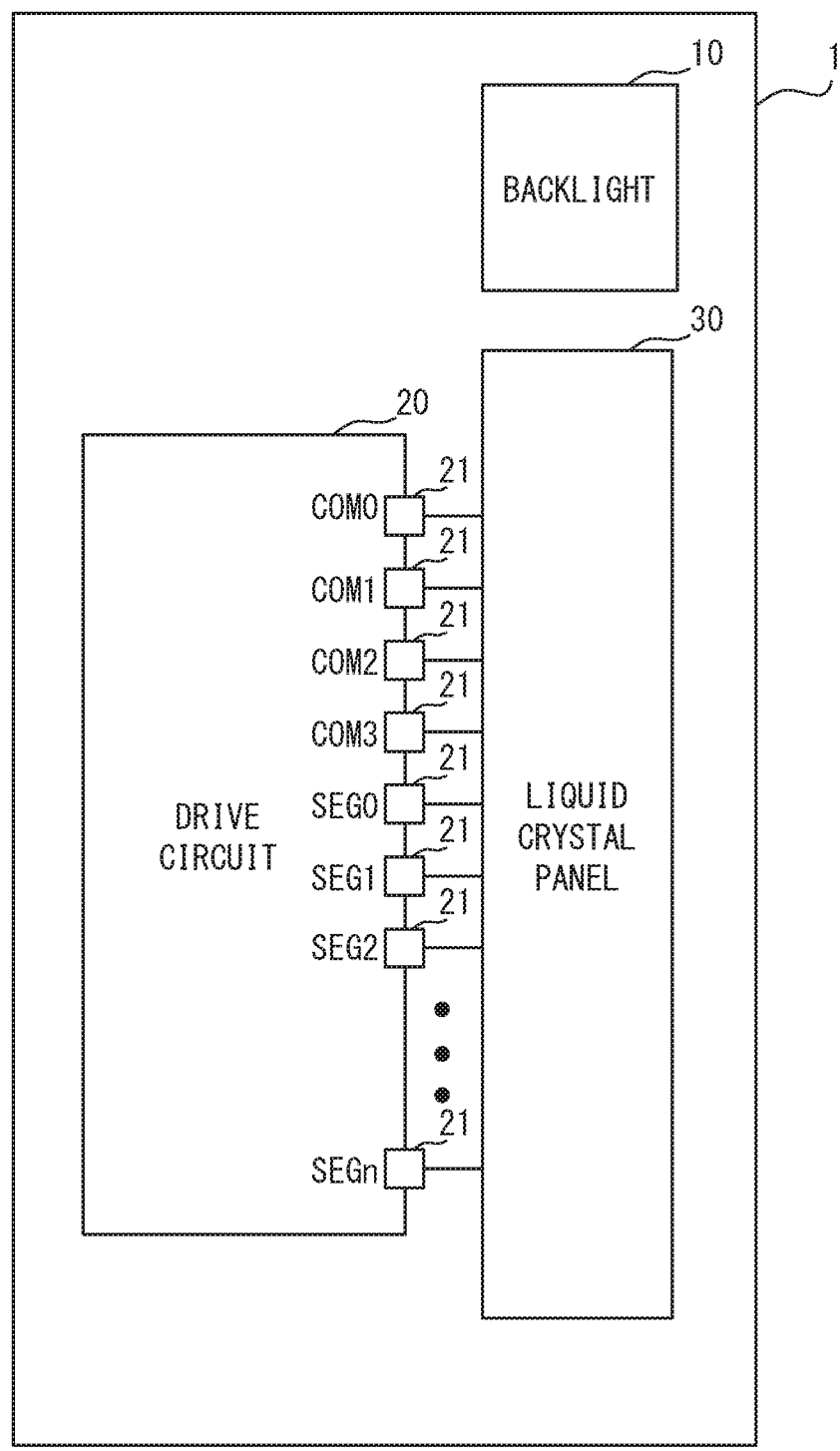
FIG. 1 is a diagram that illustrates a configuration of a liquid display apparatus.

In a drive circuit for generating a gradation voltage obtained by dividing a power supply voltage through multiple resistive elements, the number of the resistive elements increases according to the number of gradation levels. The resistance value of the resistive element has to be accurate. The following describes a reason why the resistance value has to be accurate.

An alternating current is applied to a liquid crystal. If a DC residual component during an application of the alternating current is not within a rating, the liquid crystal may be deteriorated. Variations in the resistance values of the resistive elements may lead to variations in AC voltages generated by voltage division through the resistive elements. The variations in the resistance values of the resistive elements may enlarge the DC residual component. Therefore, the resistance value of the resistive element is required to be accurate.

The cost of the drive circuit may rise, as it is required to increase the number of resistive elements, each of which has an accurate resistance value, according to the number of gradation levels. If the cost of the drive circuit for driving an inexpensive segment-type liquid crystal panel rises, the cost of a liquid crystal display apparatus including the drive circuit also rises.

The inventor of the present application also studied a case in which a voltage, which is output to the segment-type liquid crystal panel, is adjusted to a variety of voltage values through pulse width modulation control (referred to "PWM control"). If the voltage value is adjusted by the PWM control, it may not be required to increase the number of resistive elements even though the number of gradation levels increases.

However, it may be difficult for the voltage generated by the PWM control to reach a target voltage, in comparison with the voltage obtained by dividing the resistive elements having accurate resistance values. As a result, the DC residual component enlarges and may cause the liquid crystals to be deteriorated.

In one or more embodiments of the present disclosure, a liquid crystal drive circuit and a liquid crystal display apparatus are provided for suppressing the deterioration of the liquid crystal while displaying the intermediate gradation on a liquid crystal display panel with fewer number of circuit elements.

According to a first aspect of the present disclosure, a drive circuit turns on multiple segments of a liquid crystal panel at multiple luminance levels of gradation. The drive circuit for the liquid crystal panel includes a voltage output device, a resistive voltage dividing circuit, and a low-pass filter. The voltage output device has a pulse-signal output port, a first port and a second port. The pulse-signal output port outputs a pulse signal, which is modulated by pulse width modulation. The first port and the second port switch an output between a DC power supply voltage and a ground voltage. The resistive voltage dividing circuit is connected to the first port and the second port. The low-pass filter has an input and an output. The input of the low-pass filter connected to a voltage output node of the resistive voltage dividing circuit and the pulse-signal output port. The output of the low-pass filter connected to a terminal, which outputs a voltage to the liquid crystal panel.

According to a second aspect of the present disclosure, a liquid crystal display apparatus includes a liquid crystal panel having multiple segments and the drive circuit according to the first aspect. The voltage output device in the drive circuit outputs a pulse signal having a corrected duty ratio corrected from a reference duty ratio according to luminance of the intermediate gradation with a correction value, in a situation where the voltage output device turns on the segments at intermediate gradation. The correction value is preliminarily set for each of the segments.

According to a third aspect of the present disclosure, a liquid crystal display apparatus includes a liquid crystal panel having multiple segments and the drive circuit according to the first aspect. The liquid crystal panel includes an electrode representing a partial shape of the segments. Both ends of the electrode are connected to an identical terminal included in the drive circuit. When the drive circuit turns on the segments at intermediate gradation, the voltage output device outputs a pulse signal having a duty ratio according to the intermediate gradation. Since the voltage at a time of the segments turned on at the intermediate gradation is adjusted to the duty radio of the pulse signal, it may not be required to include resistive elements according to the number of gradation levels of the intermediate gradation. Therefore, it is possible to display the intermediate gradation with fewer number of the circuit elements.

In a situation of turning off the segments, the voltage output device executes turn-off control in which a first state and a second state are alternatively repeated. The first state in the turn-off control refers to a state in which the first port outputs the DC power supply voltage and the second port outputs the ground voltage. The second state in the turn-off control refers to a state in which the first port outputs the ground voltage and the second port outputs the DC power supply voltage. In the turn-off control, the resistive voltage dividing circuit generates a voltage. Since it may be possible to suppress an excessive increase in a DC residual component in a situation of turning off the segments, it may be possible to suppress the deterioration of the liquid crystals.

First Embodiment

The following describes the present embodiment with reference to the drawings. FIG. 1 illustrates an electrical configuration of a liquid crystal display apparatus 1 according to the present embodiment. The liquid crystal display apparatus 1 includes a backlight 10, a drive circuit 20, and a liquid crystal panel 30.

The backlight 10 is disposed at a rear surface of the liquid crystal panel 30, and irradiates light toward the liquid crystal panel 30.

The drive circuit 20 includes multiple terminals 21. The liquid crystal panel 30 includes a common electrode COM or a segment electrode SEG (see FIGS. 4, 5). The common electrode COM or the segment electrode SEG is connected to the multiple terminals 21. The terminal 21 outputs a drive signal, which drives liquid crystals included in the liquid crystal panel 30.

Figure 2:
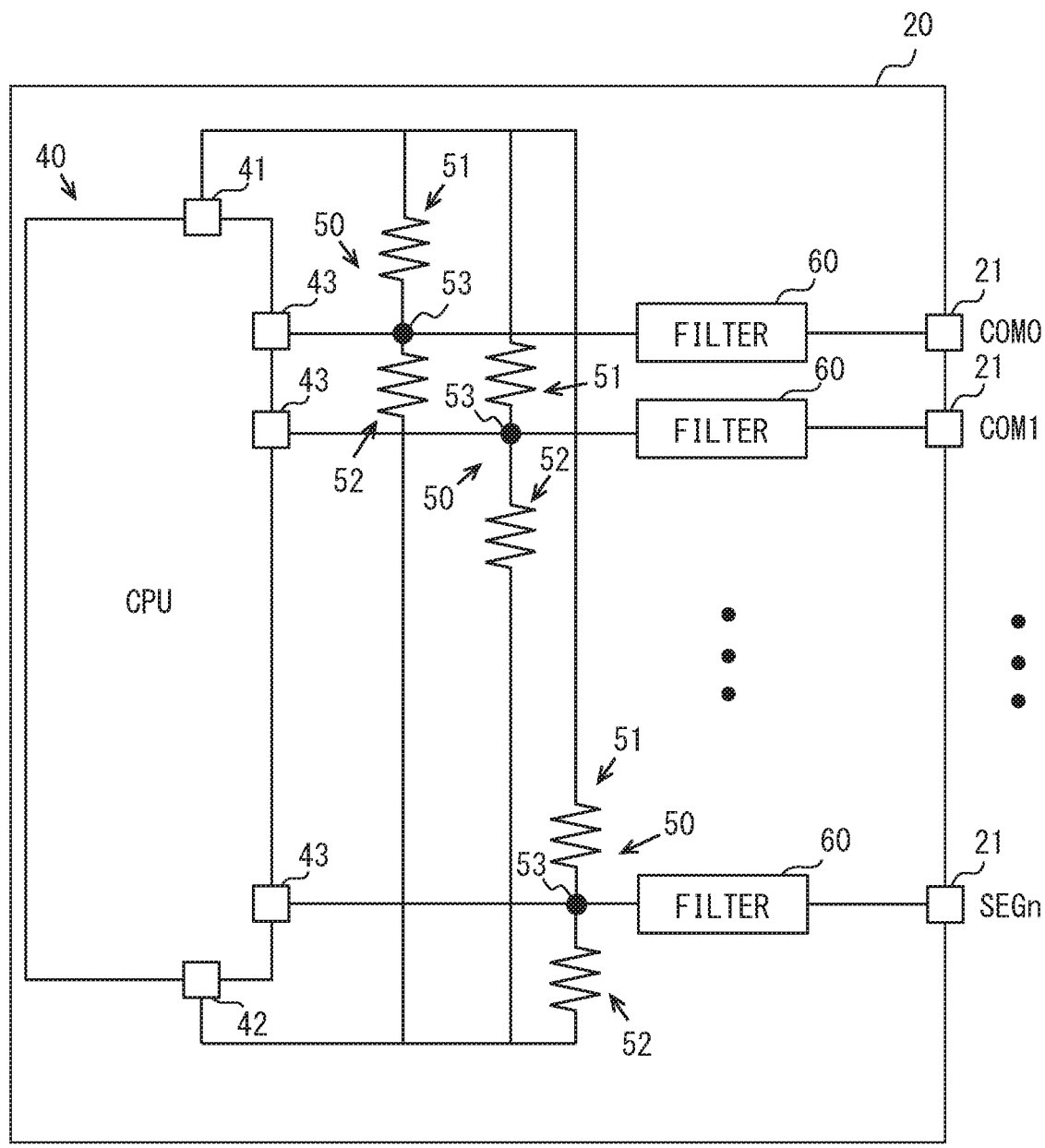
FIG. 2 is a diagram that illustrates an internal configuration of a drive circuit.

As shown in FIG. 2, the drive circuit 20 includes a CPU 40, a resistive voltage dividing circuit 50 and a filter 60. The CPU 40 is a voltage output device, and includes three types of ports having a first port 41, a second port 42, and third ports 43. The number of third ports 43 is the same as the number of terminals 21.

The first port 41, the second port 42 and the third port 43 are input/output ports. The input/output port may be switched between a state functioning as an input port and a state functioning as an output port through software control.

The first port 41, the second port 42 and the third port 43 may selectively output 5V as a direct-current power supply voltage supplied to the CPU 40 or 0V as a ground voltage.

The CPU 40 may output a pulse signal of which a pulse width may be changed by PWM control. The third port 43 outputs the pulse signal. The third port 43 is a pulse-signal output port, which outputs the pulse signal.

The number of the resistive voltage dividing circuits 50 is the same as the number of the third ports 43. Each resistive voltage dividing circuit 50 includes a first resistor 51 and a second resistor 52, which are connected in series. The first resistor 51 has: a first end that is connected to the first port 41; and a second end that is connected to the second resistor 52. The second resistor 52 has: a first end that is connected to the first resistor 51; and a second end that is opposite to the first end of the second resistor 52. The second end of the second resistor 52 is connected to the second port 42. The resistance ratio between the first resistor 51 and the second resistor 52 is a ratio for generating a turn-off control voltage. For example, the resistance value of the first resistor 51 is 10 kΩ, and the resistance value of the second resistor 52 is 20 kΩ. In a situation where the voltage of the first port 41 is 5V and the voltage of the second port 42 is 0V, the turn-off control voltage is 3.33V. In a situation where the first port 41 is 0V and the second port 42 is 5V, the turn-off control voltage is 1.67V.

The turn-off control voltage is a voltage applied to the corresponding common electrode COM and the segment electrode SEG for applying a turn-off voltage to a segment 31 to be turned off (see FIGS. 4, 5), in a situation of executing the turn-off control. The voltage applied to the segment 31 is a voltage difference between the voltage of the common electrode COM and the voltage of the segment electrode SEG.

Figure 3:
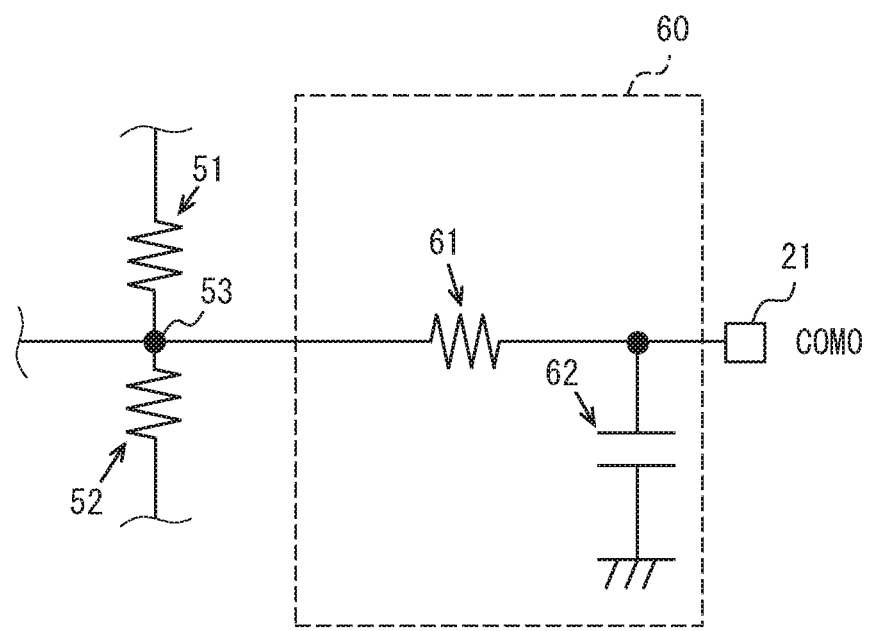
FIG. 3 is a diagram that illustrates a configuration of a filter.

The filter 60 is a low-pass filter including a resistor 61 and a capacitor 62, as shown in FIG. 3. The resistor 61 has a first end connected between the first resistor 51 and the second resistor 52. The resistor 61 also has a second end connected to the capacitor 62 and the terminal 21.

A node at which the resistor 61 is connected to the resistive voltage dividing circuit 50 may be referred to as a voltage output node 53. The voltage generated by the resistive voltage dividing circuit 50 is output from the voltage output node 53 to the filter 60. Since the voltage generated by the resistive voltage dividing circuit 50 is a DC voltage, the voltage is not changed by the filter 60 and is output to the terminal 21.

The third port 43 may be connected to the voltage output node 53. The voltage output from the third port 43 is output to the terminal 21 through the filter 60. A DC voltage of 5V or 0V or a pulse signal is output from the third port 43. In a situation where a DC voltage of 5V or 0V is output from the third port 43, the voltage is not changed by the filter 60 and is output to the terminal 21. In a situation where a pulse signal is output from the third port 43, the pulse signal is converted to an analog signal by the filter 60 and is output to the terminal 21.

Figure 4:
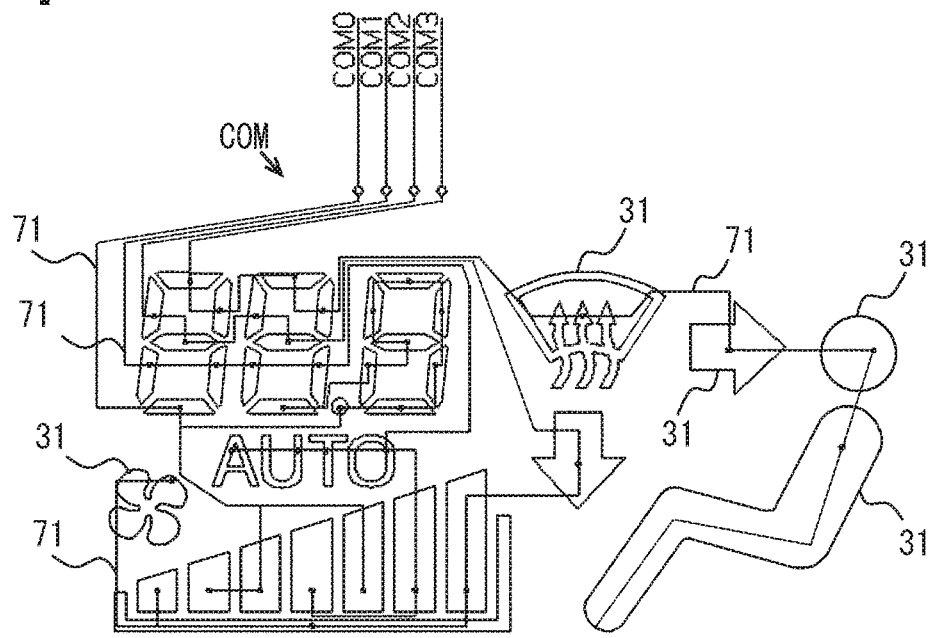
FIG. 4 is a diagram that illustrates a common electrode.
Figure 5:
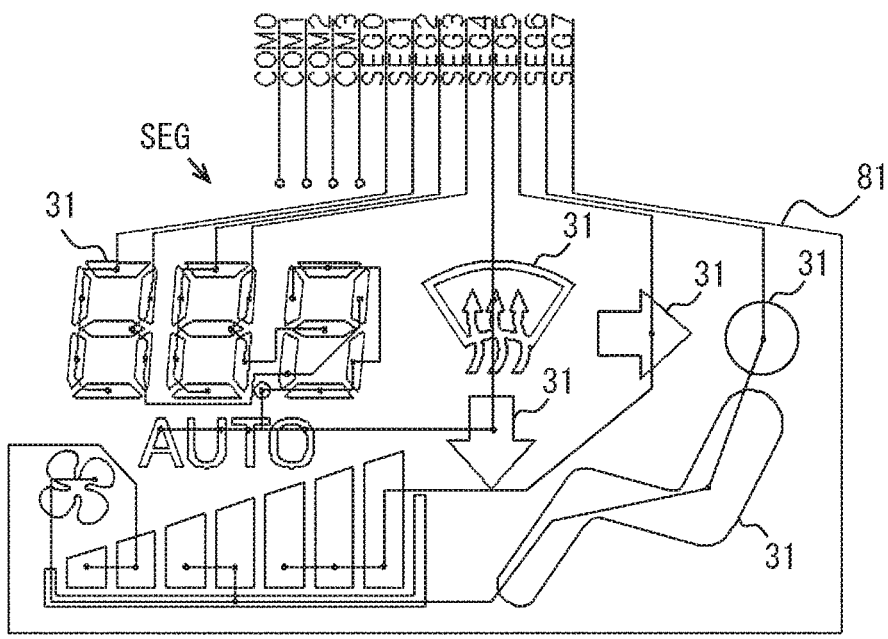
FIG. 5 is a diagram that illustrates a segment electrode.

FIG. 4 illustrates a shape of the common electrode COM included in the liquid crystal panel 30. FIG. 5 illustrates a shape of the segment electrode SEG included in the liquid crystal panel 30. The common electrode COM and the segment SEG are transparent electrodes, and are formed on transparent glass.

The common electrode COM and the segment electrode SEG have multiple shapes of the corresponding segments 31. The segment 31 is obtained by dividing a displaying graphic into multiple elements. The segments 31 shown in FIGS. 4, 5, as a whole, represent a graphic for displaying an air-conditioning state in a vehicle cabin. The combination of the common electrodes COM and the segment electrodes SEG to which the voltage is applied determines that which of the segments 31 is turned on.

In FIGS. 4, 5, a reference numeral "31" is appended only to several segments 31 which can be illustrated without overlapping with the wiring 71 of the common electrode COM and the wiring 81 of the segment electrode SEG. Each of the graphics shown in FIGS. 4, 5 is the segment 31.

More specifically, the common electrode COM includes four common electrodes COM0, COM1, COM2 and COM3. When these common electrodes are not distinguished, they are described as the common electrodes COM. More specifically, the segment electrode SEG includes eight segment electrodes SEG0, SEG1, SEG2, SEG3, SEG4, SEG5, SEG6 and SEG7. When the segment electrodes are not distinguished, they are described as the segment electrodes SEG.

Each of the common electrodes COM includes a portion of the multiple shapes of the corresponding segments 31 and the wiring 71, and the shape of each segment 31 is a partial shape of any of the four common electrodes COM0 to COM 3.

Each of the segment electrodes SEG also includes a portion of the multiple shapes of the corresponding segments 31 and the wiring 81, and the shape of each segment 31 is a partial shape of any of the eight segments electrodes SEG0 to SEG7.

The liquid crystal panel 30 has a structure in which electrode layers are stacked. The liquid crystal panel 30 has a liquid crystal layer with a first surface and a second surface. The electrode layers formed with the segment electrodes SEG are stacked on the first surface of the liquid crystal layer. The electrode layers formed with the common electrodes COM are stacked on the second surface of the liquid crystal layer. Lighting is controlled by a passive matrix method. In each segment 31, the transmittance of the backlight 10 for transmitting light is controlled by the voltage difference between the common electrode COM and the segment electrode SEG, which correspond to the segment 31.

The drive circuit 20 applies a voltage, which is determined by gradation to turn on the common electrodes COM and the segment electrodes SEG determined according to the segment 31 to be turned on. When the gradation, which turns on a light, is at the highest luminance, the corresponding common electrode COM is set to 5V, and the corresponding segment electrode SEG is set to 0V. Subsequently, the voltages of the common electrode COM and the segment electrode SEG are reversed. In a situation of describing that the segment 31 is turned on, it may be meant that the segment 31 is turned on at the highest luminance.

While the segment 31 is turned on, the voltage of the corresponding common electrode COM and the voltage of the corresponding segment electrode SEG is periodically changed from 5V to 0V or is periodically from 5V to 0V. Therefore, the voltage difference is maintained at 5V. The reason for periodically switching the voltage is to prevent the deterioration of the liquid crystal.

In a situation of alternately switching the voltage of the common electrode COM or the voltage of the segment electrode SEG between 5V and 0V, the drive circuit 20 alternately outputs 5V and 0V from the corresponding third port 43 of the CPU 40.

The drive circuit 20 sets the voltage difference between the corresponding common electrode COM and the corresponding segment electrode SEG to the turn-off voltage for the segment 31 to be turned off. The turn-off voltage is 1.67V. The reason for not setting the turn-off voltage at 0V is to stabilize the liquid crystal.

The turn-off voltage is 1.67V. For turning off the segment 31, the state of respectively outputting 3.33V and 1.67V to the corresponding common electrodes COM and the segment electrodes SEG and the state of respectively outputting 1.67V and 3.33V to the corresponding common electrodes COM and the segment electrodes SEG are periodically switched. The reason for periodically switching the voltage is the same as the situation of turning on the segment 31.

In a situation where the common electrode COM or the segment electrode SEG is set to 3.33V, the first port 41 of the CPU 40 is set to 5V, and the second port 42 of the CPU 40 is set to 0V. The third port 43 corresponding to the common electrode COM or the segment electrode SEG is set as an input port. The voltage difference between the voltage of the first port 41 and the voltage of the second port 42 is divided by the resistive voltage dividing circuit 50, and the voltage at the voltage output node 53 is 3.33V.

In a situation of setting the common electrode COM or the segment electrode SEG to 1.67V, the first port 41 of the CPU 40 corresponding to the electrode is set to 0V, and the second port 42 of the CPU 40 corresponding to the electrode is seat to 5V. The third port 43 of the corresponding common electrode COM or the corresponding segment electrode SEG is set as the input port. The voltage difference between the voltage of the first port 41 and the voltage of the second port 42 is divided by the resistive voltage dividing circuit 50, and the voltage at the voltage output node 53 is 1.67V.

The CPU 40 outputs a DC voltage, in a situation of turning on the segment 31 and in a situation of turning off the segment 31. In a situation of turning on the segment 31 at intermediate gradation, the voltage difference between the common electrode COM and the segment electrode SEG, which correspond to the segment 31, is set based on the gradation. The intermediate gradation has a lower luminance than the maximum luminance.

The corresponding voltages of the common electrode COM and the segment electrode SEG for generating the voltage difference are preliminarily set. The voltage of the common electrode COM and the voltage of the segment electrode SEG are periodically switched during the intermediate gradation. The voltage difference according to the intermediate gradation is continuously applied across both electrodes. The sign of the voltage difference is inverted periodically.

In a situation of the intermediate gradation, the third port 43 outputs a pulse signal having a duty ratio. The pulse signal having the duty ratio represents that a voltage subsequently passing through the filter 60 is determined by the gradation. The third port 43 is connected to the common electrode COM and the segment electrode SEG.

Figure 6:
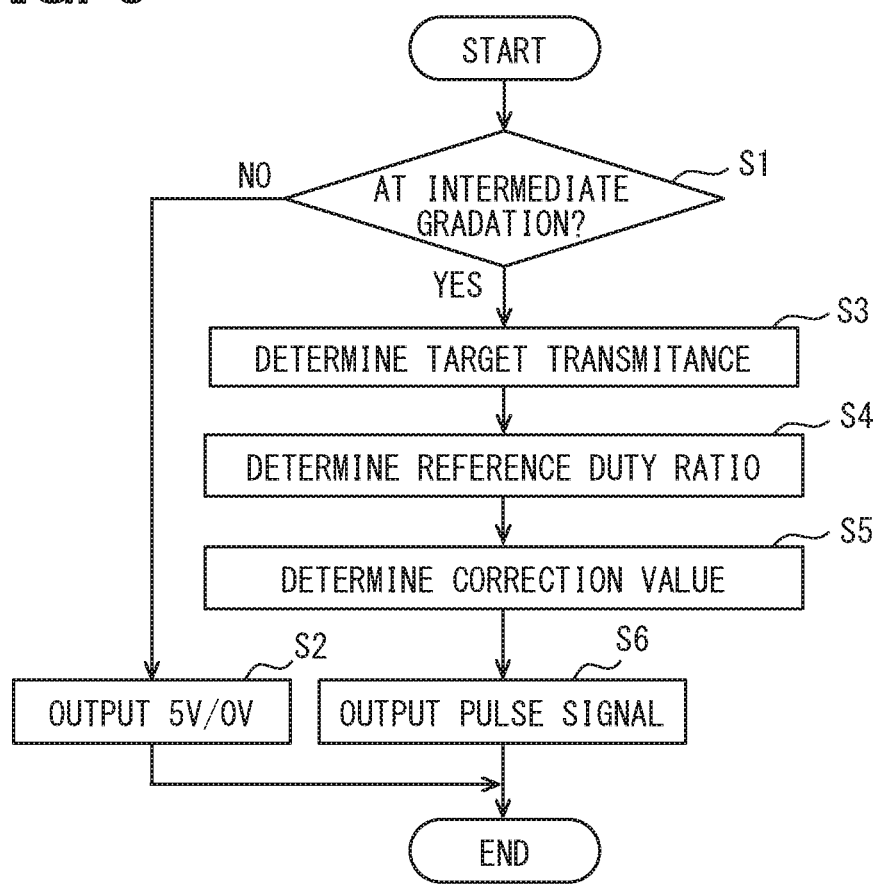
FIG. 6 is a flowchart that illustrates a process executed by a CPU.

FIG. 6 illustrates a process executed by the CPU 40. The CPU 40 periodically executes the process illustrated in FIG. 6, in a situation that the power supply is turned on. The CPU 40 executes the process illustrated in FIG. 6 for each segment 31.

In step S1 (hereinafter the wording "step" is omitted), it is determined whether it is required to turn on the segment 31 at the intermediate gradation. It is preliminarily set for when the segment 31 will be turned on at the intermediate gradation. An operation button connected to the liquid-crystal display apparatus 1 is operated to change the corresponding segment 31 from a turn-on state to a turn-off state or from the turn-off state to the turn-on state. During a changing process, the segment is turned on at the intermediate gradation temporarily.

When the determination at S1 is NO, the process proceeds to S2. In S2, the segment 31 is turned on or off. In a situation of turning on the segment 31, the third port 43 of the corresponding segment 31 outputs 5V and 0V, both of the voltages are switched periodically. The third port 43 is a universal output port. The pulse-signal output port may output a signal having a duty ratio of 100% or a signal having a duty ratio of 0%.

In a situation of turning off the segment 31, the CPU 40 executes turn-off control. In the turn-off control, the third port 43 corresponding to the segment 31 is set as an input port. The state of outputting 5V from the first port 41 and outputting 0V from second port 42 and the state of outputting 0V from the first port 41 and outputting 5V from the second port 42 are alternatively repeated. In a situation of executing the turn-off control, the voltage at the voltage output node 53 corresponding to the segment 31 periodically changes to 1.67V and 3.33V.

If the determination of S1 is YES, the process proceeds to S3. In S3, target transmittance is determined. The target transmittance is determined based on an elapsed time during which light-modulation control is executed. The light-modulation control is executed for changing the segment 31 from an on-state to an off-state or from the off-state to the on-state. The higher ratio of the elapsed time to the time of executing the light-modulation control implies that the luminance level is set closer to a final state. In other words, the luminance level is set closer to the on-state or the off-state. If the luminance level is determined, the target transmittance is determined.

Figures 7, 8:
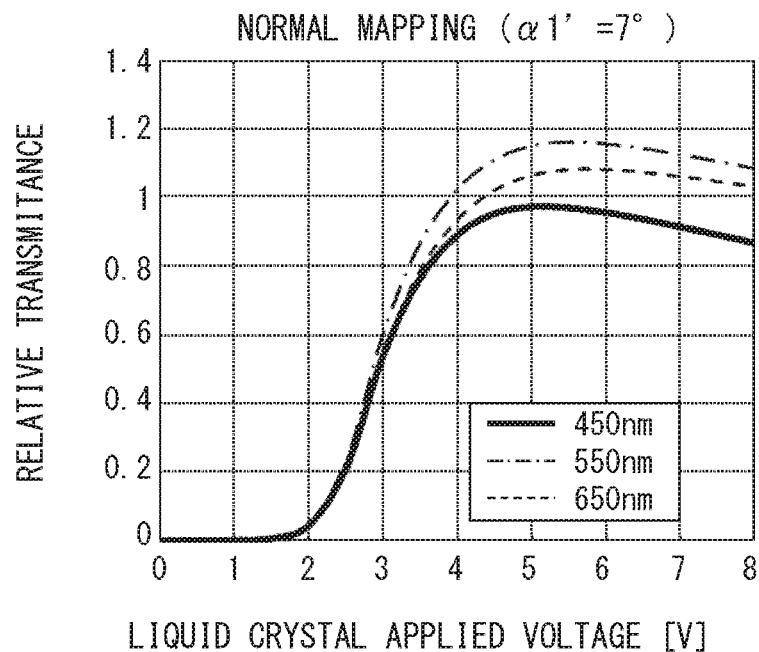
FIG. 7 is a diagram that illustrates a relationship between a liquid crystal applied voltage and transmittance.
FIG. 8 is a diagram that illustrates correction value mapping for correcting a reference duty ratio.

In S4, a reference duty ratio for setting the target transmittance is determined. The target transmittance is determined in S3. FIG. 7 illustrates an example of the relationship between the liquid-crystal applied voltage and the transmittance. In the present embodiment, the CPU 40 determines the voltage applied to the segment 31 with reference to the relationship between the liquid crystal applied voltage and the transmittance as illustrated in FIG. 7.

The respective voltages of the common electrode COM and the segment electrode SEG are determined, so that the voltage difference between the voltage of the common electrode COM and the voltage of the segment electrode SEG becomes the applied voltage. The sign of the applied voltage is periodically inverted in a situation of turning on the segment 31 and in a situation of turning off the segment 31. The voltage of the common electrode COM and the voltage of the segment electrode SEG respectively determine two types of voltages, which change periodically. The duty ratio of the determined voltage is set to be the reference duty ratio. Since two types of voltages of the common electrode COM and the segment electrode SEG are determined, two types of the reference duty ratios are also determined.

In the present embodiment, the pulse signal having the reference duty ratio is output to the common electrode COM. For the segment electrode SEG, a correction value for correcting the reference duty ratio is determined in S5 instead of adopting the reference duty ratio as the duty ratio of the pulse signal actually output from the third port 43. The duty ratio of the pulse signal to be actually output from the third port 43 is a value obtained by correcting the reference duty ratio with a correction value.

The reason for correcting the reference duty ratio is that a phenomenon of having different luminance levels of different segments 31 even with the same duty ratio occurs, in a situation of controlling the duty ratio and turning on the segments 31 at the intermediate gradation. The phenomenon becomes more obvious through an experiment. Although it is not clear why this phenomenon occurs, it may be considered that a voltage drop occurs as the distance from the terminal 21 increases due to wiring impedance.

This phenomenon does not occur in a situation of turning on the segment 31 at the highest luminance level. The reason is that, in a situation of turning on the segment 31 at the highest luminance level, the voltage applied to the segment 31 is 5V and a change in the transmittance is not relatively large in the vicinity of 5V as illustrated in FIG. 7.

FIG. 8 illustrates an example of correction value mapping adopted in S5. In the correction value mapping illustrated in FIG. 8, a horizontal axis refers to the common electrode COM, and a vertical axis refers to the segment electrode SEG. The combination of the common electrode COM and the segment electrode SEG determines the segment 31 to be turned on. FIG. 8 illustrates mapping for indicating a correction value for each segment 31. The correction value is a value to be added to the reference duty ratio in a situation of executing correction.

In S6, the pulse signal is output from the third port 43 at a timing of turning on the segment 31. The third port 43 is connected to the common electrode COM and the segment electrode SEG including the segment 31, which is turned on at the intermediate gradation. Regarding the duty ratio of the output pulse signal, the common electrode COM has the reference duty ratio, and the segment electrode SEG has a corrected duty ratio obtained by adding the correction value to the reference duty ratio.

In the present embodiment, since a voltage is adjusted with the duty ratio of the pulse signal in a situation of turning on the segment 31 at the intermediate gradation, it may not be required to include resistive elements corresponding to the number of gradation levels of the intermediate gradation. Therefore, it may be possible to display the intermediate gradation with a fewer number of circuit elements.

In the present embodiment, the CPU 40 executes the turn-off control in a situation of turning off the segment 31. In a situation of turning off the segment 31, the CPU 40 alternatively repeats the state of outputting 5V from the first port 41 and 0V from the second port 42 and the state of outputting 0V from the first port 41 and 5V from the second port 42. In the turn-off control, the resistive voltage dividing circuit 50 generates a voltage output to the terminal 21. Therefore, it may be possible to suppress an excessive increase in a DC residual component in a situation of turning off the segment 31. As a result, it may be possible to suppress the deterioration of the liquid crystals.

In the present embodiment, in a situation of turning on the segment 31 at the intermediate gradation, the duty ratio of the pulse signal output to the segment electrode SEG of the corresponding segment 31 is set as the corrected duty ratio obtained by correcting the reference duty ratio. Therefore, it may be possible to suppress a situation in which variations in the luminance levels occur within one shape, when the one shape, which has multiple segments 31, is turned on at the intermediate gradation.

Second Embodiment

The following describes the second embodiment. In the following description of the second embodiment, elements having the same reference numerals as those used so far are the same as the elements having the same reference numerals in the previous embodiment, except when specifically mentioned. When only a part of the configuration is described, the embodiment described above may be applied to other parts of the configuration.

Figure 9:
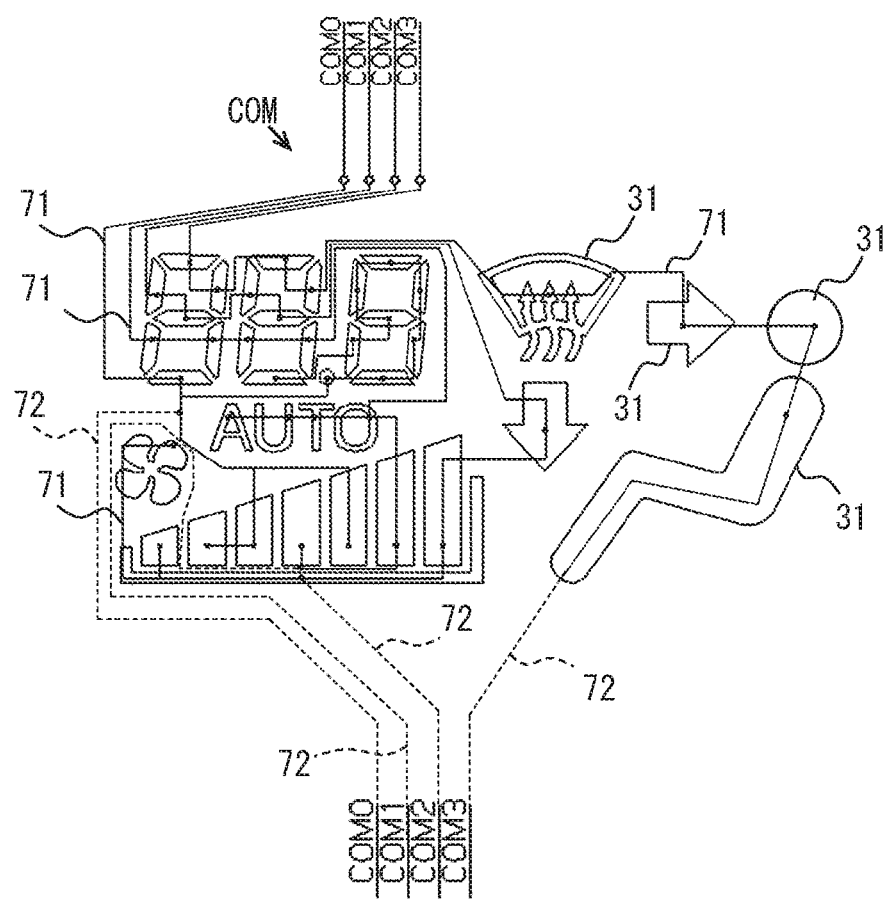
FIG. 9 is a diagram that illustrates a common electrode according to a second embodiment.

FIG. 9 illustrates the common electrode COM according to the second embodiment. Regarding the common electrode COM illustrated in FIG. 9, the segment 31 is the same as the one illustrated in FIG. 3. The wiring 71, which is same as the one illustrated in FIG. 3, is provided. In addition to the wiring 71, the common electrode COM illustrated in FIG. 9 includes wiring 72. For distinguishing the wiring 71 and wiring 72, the wiring 72 is indicated by a broken line in FIG. 9. Although the wiring 72 is indicated by the broken line, the wiring 72 is a wire electrically connected from one end to another end.

One end of the wiring 72 is connected to one end of the wiring 71. The one end of the wiring 71 is opposite to the other end of the wiring 71 connected to the terminal 21. The other end of the wiring 72 is connected to the same terminal 21, which is connected with the wiring 71. One wiring including the wiring 71 and wiring 72 has both ends connected to the same terminal 21.

Since the both ends of the one wiring are connected to the same terminal 21, the both ends of the one wiring have the same potential. When the both ends of the one wiring have the same potential, it may be possible to suppress a situation of having variances in the potential of the wiring due to the distance from the terminal 21. Therefore, in the second embodiment, it may not be required to execute the correction described in the first embodiment. In the second embodiment, the CPU 40 performs the process without S5 in FIG. 6.

In the second embodiment, both ends of the common electrode COM are connected to the same terminal 21. Since the both ends of the common electrode COM have the same potential, it may be possible to suppress a degree of variances in a voltage caused by the distance from the terminal 21. Therefore, it may be possible to suppress an occurrence of luminance variances, in a situation of turning on the segment 31 at the intermediate gradation.

Here, the process of the flowchart or the flowchart described in this application includes multiple sections (or steps), and each section is expressed as, for example, S1. Further, each section may be divided into several subsections, while several sections may be combined into one section. Furthermore, each section thus configured may be referred to as a device, module, or means.

Although the present disclosure has been described in accordance with the example embodiments, it is understood that the disclosure is not limited to such example embodiments or structures. The present disclosure encompasses various modifications and variations within the scope of equivalents. Furthermore, various combination and formation, and other combination and formation including one, more than one or less than one element may be made in the present disclosure.

(First Modification)

In the first embodiment, the duty ratio of the pulse signal for outputting a voltage to the segment electrode SEG is corrected. The pulse signal for outputting a voltage to the common electrode COM is set as the reference duty ratio. It may also be possible that the duty ratio of the pulse signal for outputting a voltage to the segment electrode SEG and the duty ratio of the pulse signal for outputting a voltage to the common electrode COM are corrected from the reference duty ratio. In this situation, the correction value is different from the one described in the first embodiment.

(Second Modification)

The method for correcting the reference duty ratio may not be limited to a method in which the correction value is added. It may also be possible to execute correction in which a correction coefficient is multiplied to the reference duty ratio.

(Third Modification)

In the second embodiment, both ends of the common electrode COM are connected to the same terminal 21. It may be possible that both ends of the segment electrode SEG are connected to the same terminal 21, instead of the common electrode COM. It may also be possible that both ends of the common electrode COM and both ends of the segment electrode SEG are connected to the same terminal 21.

What is claimed is:

1. A drive circuit for driving a liquid crystal panel having a plurality of segments by turning on the segments of the crystal panel at a plurality of luminance levels of gradation, the drive circuit comprising:
    a voltage output device that includes
        a pulse-signal output port that outputs a pulse signal, which is modulated by pulse width modulation, and
        a first port and a second port that are configured to switch an output between a DC power supply voltage and a ground voltage;
    a resistive voltage dividing circuit that is connected to the first port and the second port; and
    a low-pass filter that has an input and an output, the input connected to a voltage output node of the resistive voltage dividing circuit and the pulse-signal output port, the output connected to a terminal, which outputs a voltage to the liquid crystal panel,
    wherein, in a situation of turning off the segments, the voltage output device executes turn-off control in which a first state and a second state are alternatively repeated,
    wherein the first state refers to a state in which the first port outputs the DC power supply voltage and the second port outputs the ground voltage,
    wherein the second state refers to a state in which the first port outputs the ground voltage and the second port outputs the DC power supply voltage, and
    wherein, in a situation of turning on the segments at intermediate gradation, the voltage output device outputs from the pulse-signal output port the pulse signal having a duty ratio according to the intermediate gradation.

2. A liquid crystal display apparatus comprising:
    a liquid crystal panel having a plurality of segments; and
    the drive circuit according to claim 1,
    wherein, in a situation of turning on the segments at the intermediate gradation, the voltage output device outputs the pulse signal having a corrected duty ratio corrected with a correction value from a reference duty ratio,
    wherein the reference duty ratio is determined based on luminance of the intermediate gradation, and
    wherein the correction value is preliminarily set for each of the segments.

3. A liquid crystal display apparatus comprising:
    a liquid crystal panel having a plurality of segments; and
    the drive circuit according to claim 1,
    wherein the liquid crystal panel includes an electrode representing a partial shape of the segments, and wherein both ends of the electrode are connected to an identical terminal included in the drive circuit.

4. The liquid crystal display apparatus according to claim 3,
wherein the identical terminal is connected to the output of the low-pass filter, and
wherein the identical terminal outputs a voltage to the liquid crystal panel.

* * * * *